(12) United States Patent
Yang et al.

(10) Patent No.: US 9,773,520 B2
(45) Date of Patent: Sep. 26, 2017

(54) IMPRINT PATTERN GUIDED SELF-ASSEMBLY OF LAMELLAR BLOCK COPOLYMER FOR BPM

(71) Applicant: Seagate Technology LLC, Cupertino, CA (US)

(72) Inventors: XiaoMin Yang, Livermore, CA (US); Shuaigang Xiao, Fremont, CA (US); Yautzong Hsu, Fremont, CA (US); HongYing Wang, Fremont, CA (US); Kim Y. Lee, Fremont, CA (US)

(73) Assignee: Seagate Technology LLC, Cupertino, CA (US)

( * ) Notice: Subject to any disclaimer, the term of this patent is extended or adjusted under 35 U.S.C. 154(b) by 553 days.

(21) Appl. No.: 14/158,611

(22) Filed: Jan. 17, 2014

(65) Prior Publication Data

US 2015/0206548 A1    Jul. 23, 2015

(51) Int. Cl.
*G03F 7/20*     (2006.01)
*H01L 21/28*    (2006.01)
*G11B 5/855*    (2006.01)
*G03F 7/00*     (2006.01)

(52) U.S. Cl.
CPC ............ *G11B 5/855* (2013.01); *G03F 7/0002* (2013.01)

(58) Field of Classification Search
CPC ... H01L 21/8239; H01L 21/28; H01L 29/423; H01L 29/788; H01L 29/792; H01L 29/66
USPC ................... 264/402, 479, 480, 320; 425/406
See application file for complete search history.

(56) References Cited

U.S. PATENT DOCUMENTS 8,673,541 B2 * 3/2014 Xiao .................... G03F 7/0002
                                                430/296
2011/0200795 A1    8/2011 Lammers et al.

FOREIGN PATENT DOCUMENTS

WO    2013152928 A1    10/2013
WO    2014023589 A1    2/2014

* cited by examiner

*Primary Examiner* — Joseph S Del Sole
*Assistant Examiner* — Thukhanh T Nguyen

(57) ABSTRACT

The embodiments disclose a method of using a trimmed imprinted resist and chemical contrast pattern to guide a directed self-assembly (DSA) of a predetermined lamellar block copolymer (BCP), creating chromium (Cr) lamellar guiding lines using the BCP and DSA in a dry Cr lift-off process and etching the Cr lamellar guiding line patterns into a substrate to fabricate the imprint template.

9 Claims, 8 Drawing Sheets

IMPRINT PATTERN GUIDED SELF-ASSEMBLY OF LAMELLAR BLOCK COPOLYMER FOR BPM

DETAILED DESCRIPTION OF THE INVENTION

In a following description, reference is made to the accompanying drawings, which form a part hereof, and in which is shown by way of illustration a specific example in which the invention may be practiced. It is to be understood that other embodiments may be utilized and structural changes may be made without departing from the scope of the present invention.

General Overview:

It should be noted that the descriptions that follow, for example, in terms of imprint pattern guided self-assembly of lamellar block copolymer for BPM is described for illustrative purposes and the underlying system can apply to any number and multiple types stack. In one embodiment of the present invention, the imprint pattern guided self-assembly of lamellar block copolymer (BCP) for BPM can be configured using a quartz substrate. The imprint pattern guided self-assembly of lamellar block copolymer for BPM can be configured to include vertically oriented lamellar block copolymer and can be configured to include chemical contrast pattern using the present invention.

Unguided lamellar block copolymer directed self-assembly (DSA) develops curvilinear and swirling patterns. Magnetic stacks including bit-patterned media (BPM) stacks include lines. Magnetic stacks use straight lines and circular lines for magnetic material patterns.

Figure 1:
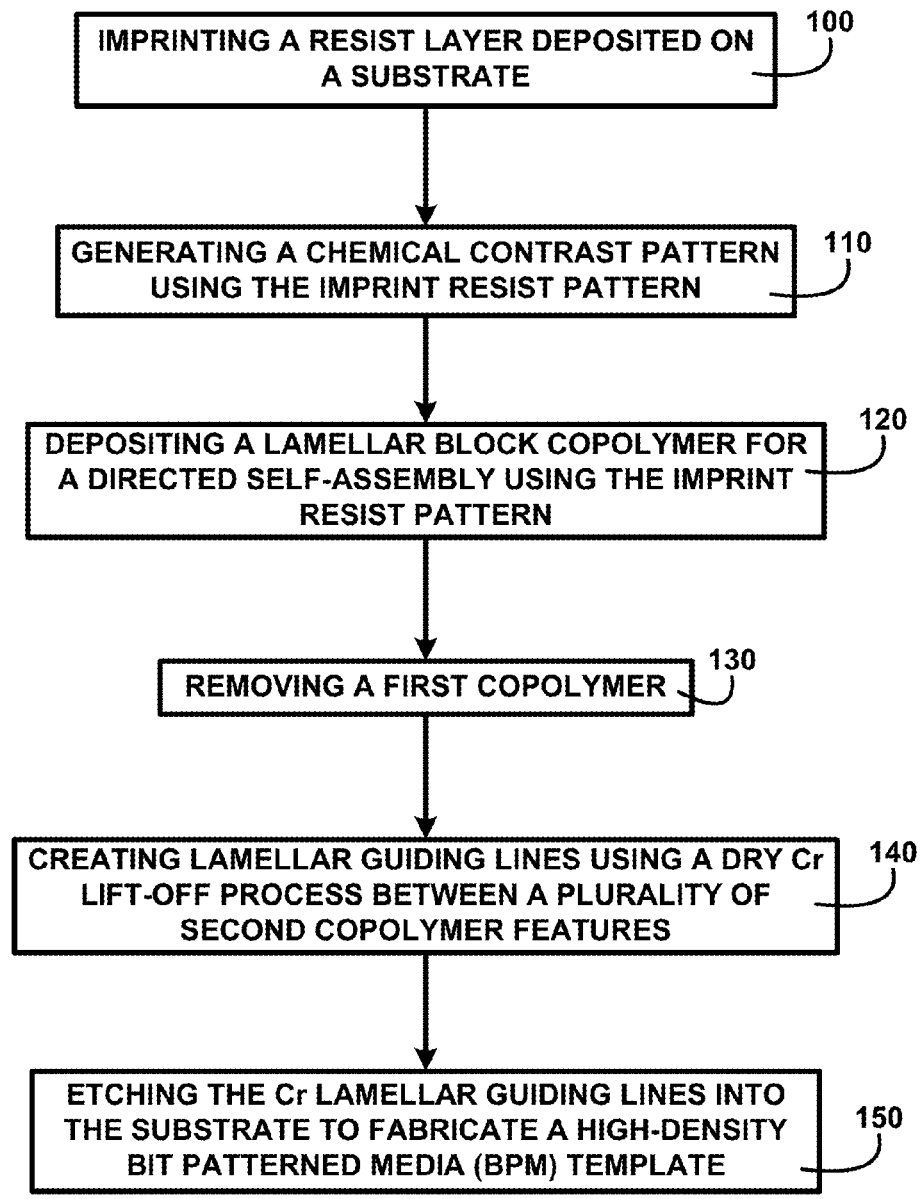
FIG. 1 shows a block diagram of an overview of imprint pattern guided self-assembly of lamellar block copolymer for BPM of one embodiment.

FIG. 1 shows a block diagram of an overview of imprint pattern guided self-assembly of lamellar block copolymer for BPM of one embodiment. FIG. 1 shows a method to fabricate templates for use in making BPM media stacks. FIG. 1 shows imprinting a resist layer deposited on a substrate 100. The imprinted resist processed by a descum and trim process to a predetermined pattern. A brush backfill is used for generating a chemical contrast pattern using the imprint resist pattern 110. Depositing a lamellar block copolymer for a directed self-assembly using the imprint resist pattern 120 is made onto the trimmed imprint resist and chemical contrast pattern. After the directed self-assembly a process is used for removing a first copolymer 130. Creating lamellar guiding lines using a dry Cr lift-off process between a plurality of second copolymer features 140 is followed by a process to remove the second copolymer. A process is used for etching the Cr lamellar guiding lines into the substrate to fabricate a high-density bit patterned media (BPM) template 150 for use in imprinting high-density bit patterned media (BPM) stacks.

DETAILED DESCRIPTION

Figure 2A:
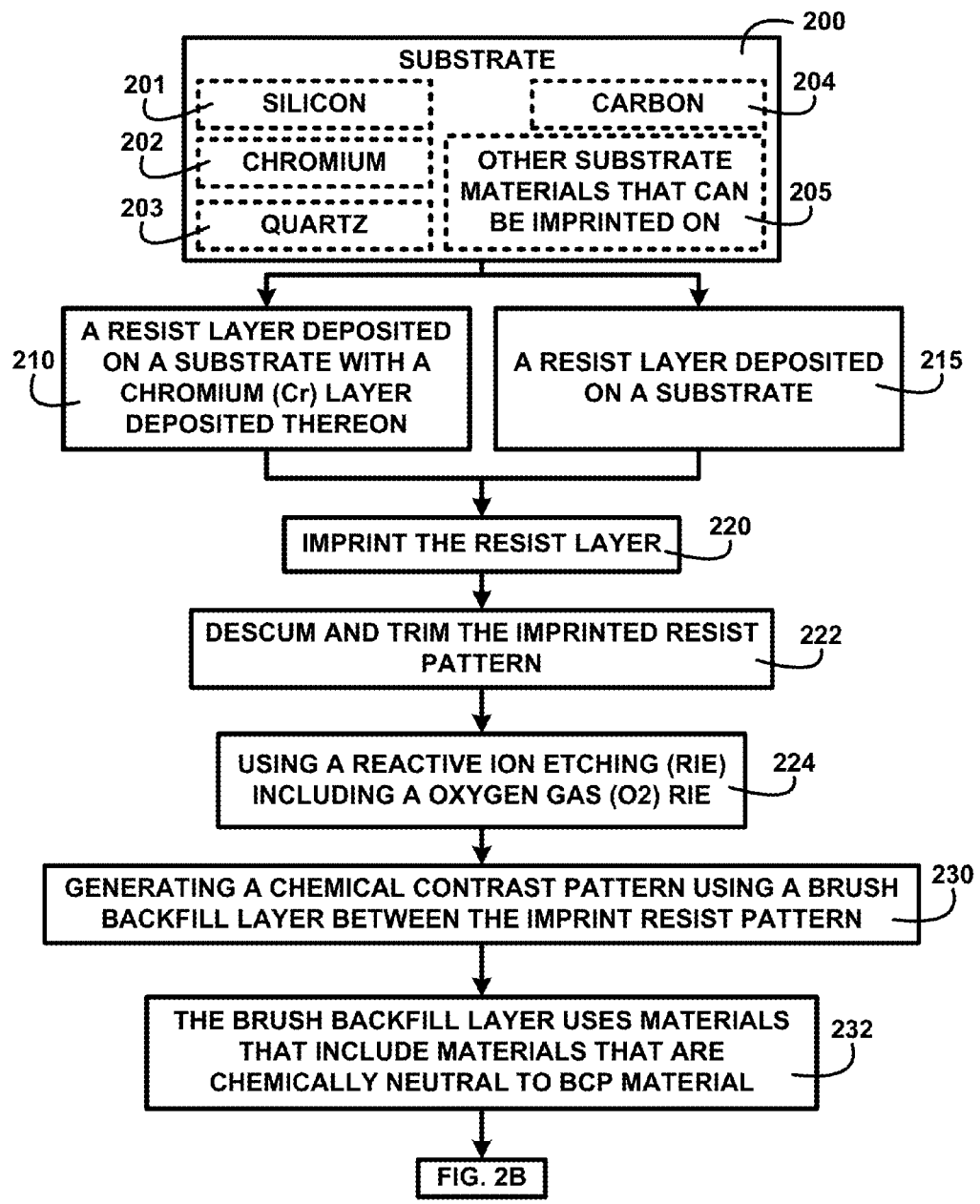
FIG. 2A shows a block diagram of an overview flow chart of imprint pattern guided self-assembly of lamellar block copolymer for BPM of one embodiment.

FIG. 2A shows a block diagram of an overview flow chart of imprint pattern guided self-assembly of lamellar block copolymer for BPM of one embodiment. FIG. 2A shows a substrate 200 made of materials including silicon 201, chromium 202, quartz 203, carbon 204 and other substrate materials that can be imprinted on 205. A resist layer deposited on a substrate 215 including a resist layer deposited on a substrate with a chromium (Cr) layer deposited thereon 210 is used with an imprint template to imprint the resist layer 220. The deposition of the resist layer includes using an imprint resist material having two additional properties: solvent stability, thermal stability, and chemical neutrality with respect to BCPs.

The imprinted template pattern is altered using a process to descum and trim the imprinted resist pattern 222. The altering process includes using a reactive ion etching (RIE) including an oxygen gas ($O_2$) RIE 224. A process is used generating a chemical contrast pattern using a brush backfill layer between the imprint resist patterns 230. The brush backfill layer uses materials that include materials that are chemically neutral to BCP material 232. The processing is described further in FIG. 2B.

Figure 2B:
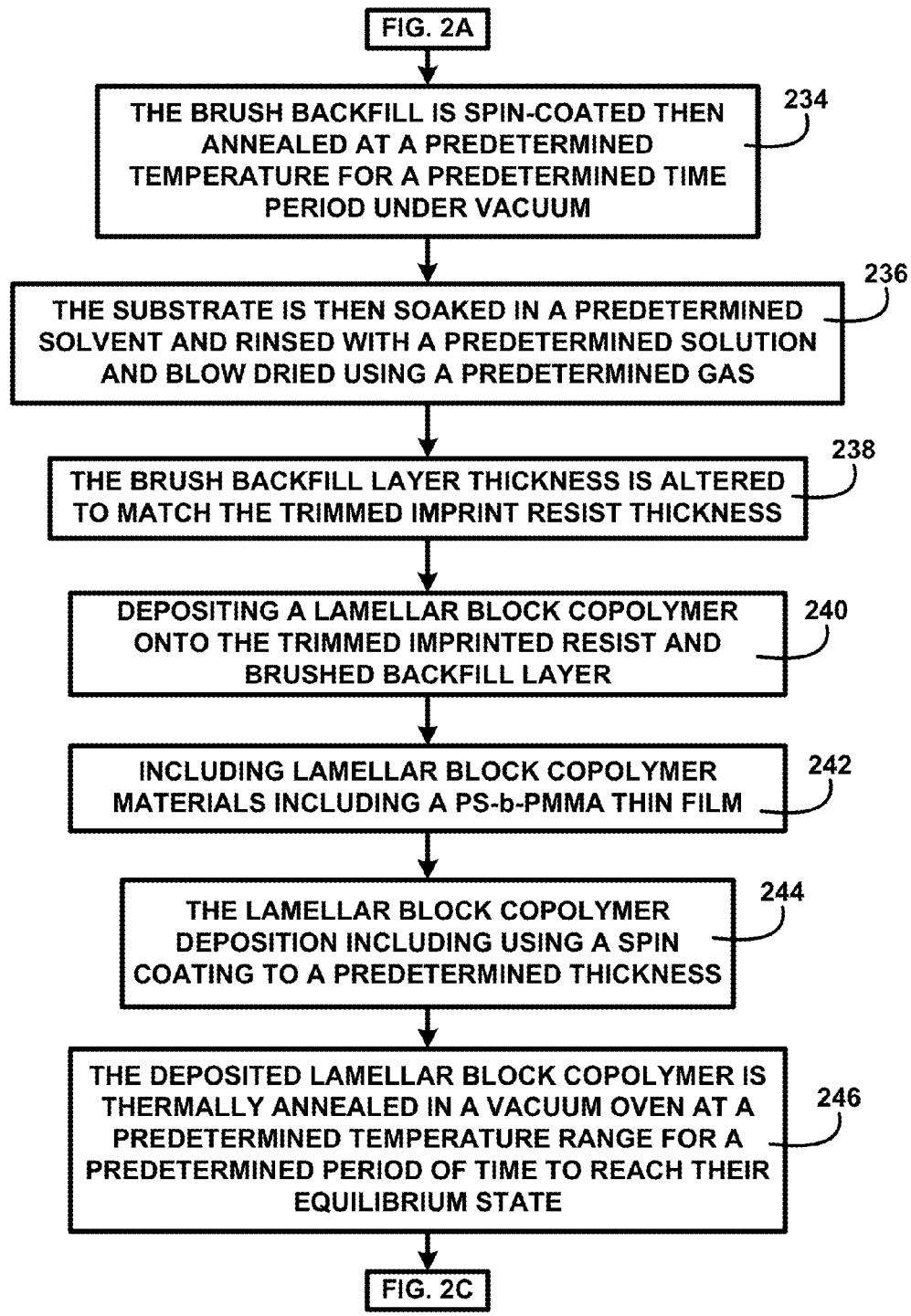
FIG. 2B shows a block diagram of an overview flow chart of lamellar block copolymer of one embodiment.

FIG. 2B shows a block diagram of an overview flow chart of lamellar block copolymer of one embodiment. FIG. 2B shows continuing from FIG. 2A a process where the brush backfill is spin-coated then annealed at a predetermined temperature for a predetermined time period under vacuum 234. The substrate is then soaked in a predetermined solvent and rinsed with a predetermined solution and blow dried using a predetermined gas 236.

The brush backfill layer thickness is altered to match the trimmed imprint resist thickness 238. The processing continues by depositing a lamellar block copolymer onto the trimmed imprinted resist and brushed backfill layer 240 including lamellar block copolymer materials including a PS-b-PMMA thin film 242. The lamellar block copolymer deposition including using a spin coating to a predetermined thickness 244 is followed where the deposited lamellar block copolymer is thermally annealed in a vacuum oven at a predetermined temperature range for a predetermined period of time to reach their equilibrium state 246. Processing descriptions continue in FIG. 2C.

Figure 2C:
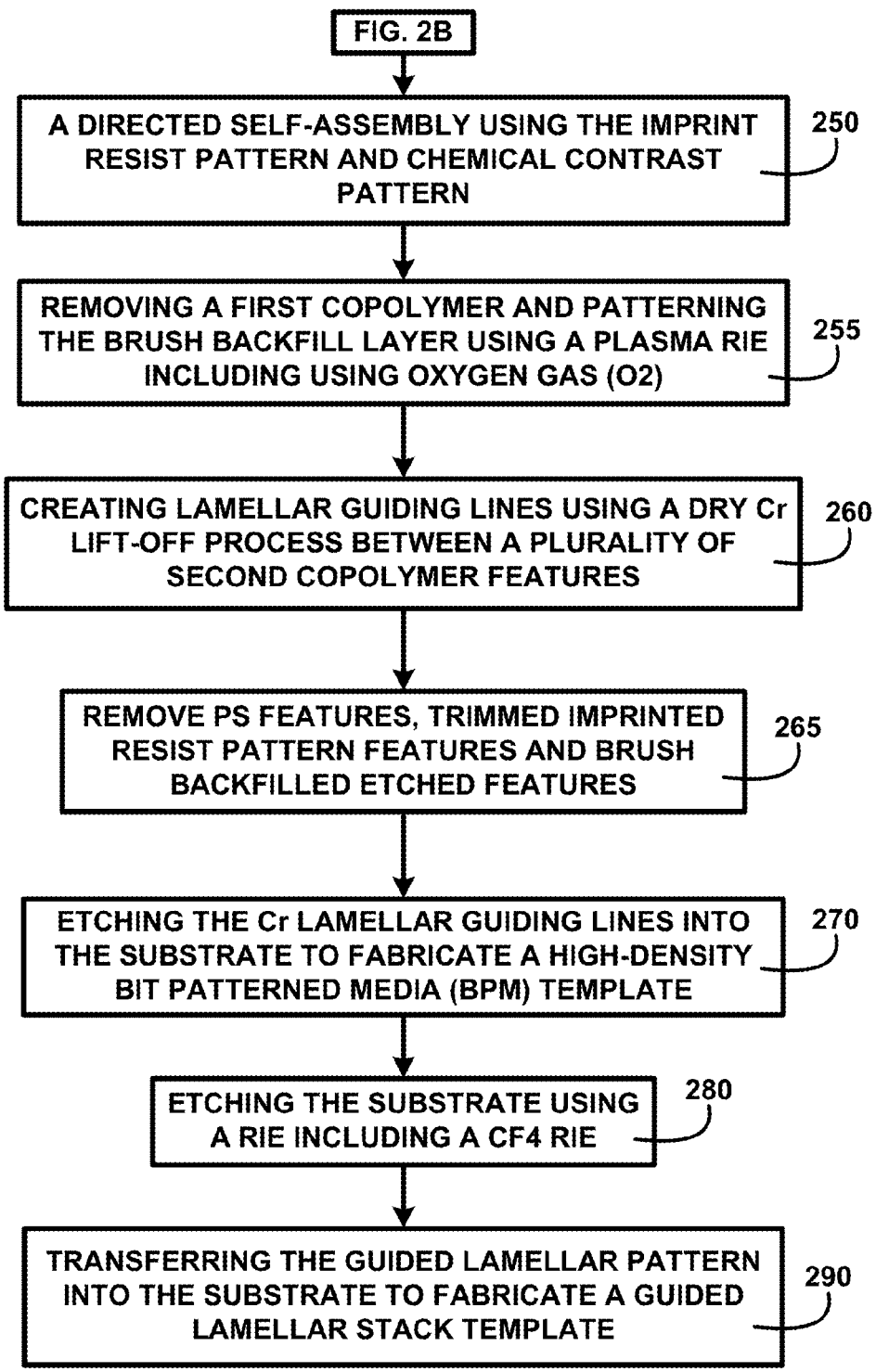
FIG. 2C shows a block diagram of an overview flow chart of lamellar guiding lines of one embodiment.

FIG. 2C shows a block diagram of an overview flow chart of lamellar guiding lines of one embodiment. FIG. 2C shows a continuation from FIG. 2B including a directed self-assembly using the imprint resist pattern and chemical contrast pattern 250. After the DSA a process is used for removing a first copolymer and patterning the brush backfill layer using a plasma RIE including using oxygen gas (O2) 255. Creating lamellar guiding lines using a dry Cr lift-off process between a plurality of second copolymer features 260.

A process is used to remove PS features, trimmed imprinted resist pattern features and brush backfilled etched features 265 including using O2 plasma to form Cr lines. Etching the substrate using a RIE including a $CF_4$ RIE 280 is used for etching the Cr lamellar guiding lines into the substrate to fabricate a high-density bit patterned media (BPM) template 270. The results of processes transferring the guided lamellar pattern into the substrate to fabricate a guided lamellar stack template 290 provides a method to imprint stacks with straight line of lamellar magnetic features.

Figure 3A:
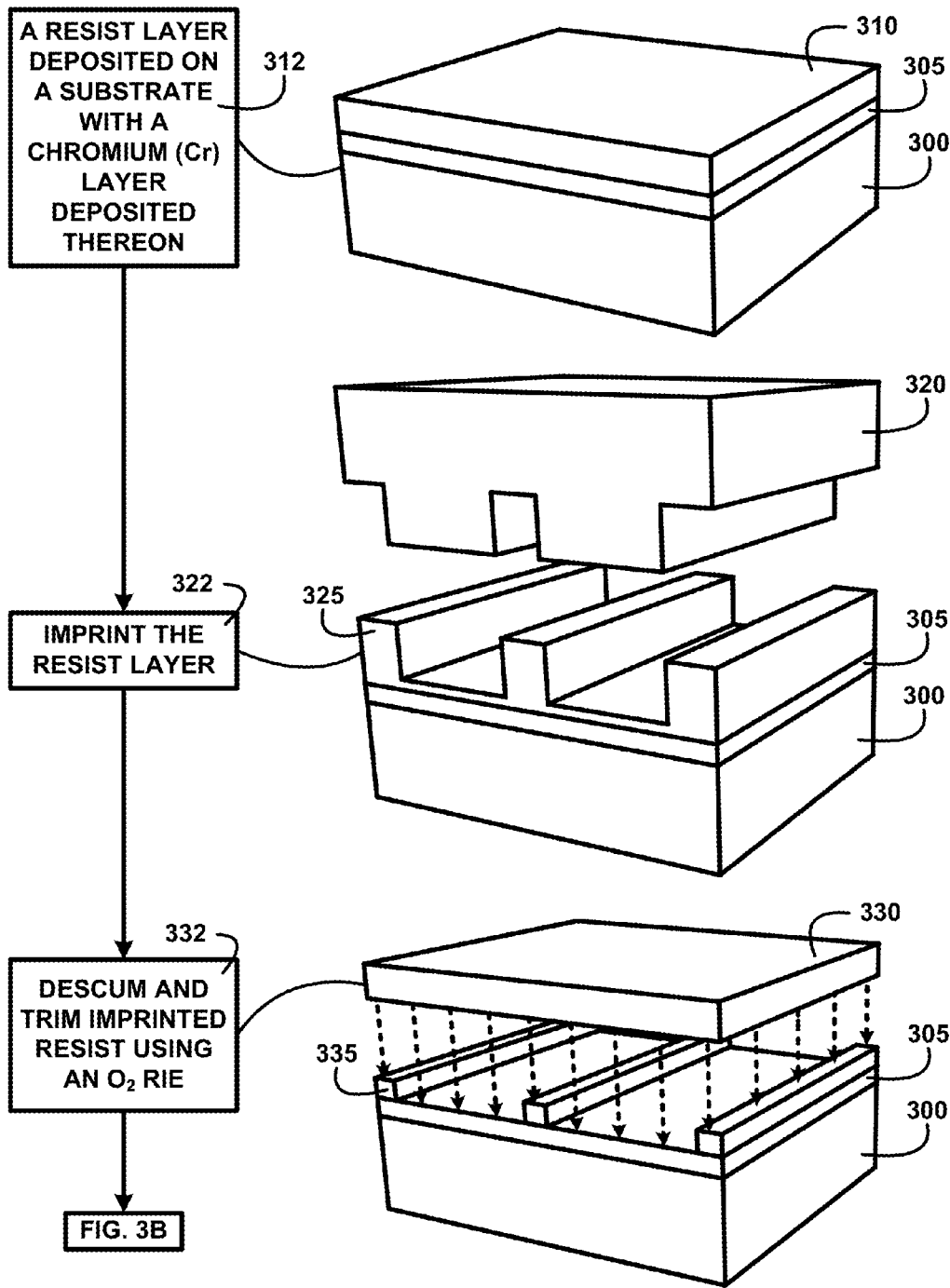
FIG. 3A shows for illustrative purposes only an example of imprinting the resist layer of one embodiment.

FIG. 3A shows for illustrative purposes only an example of imprinting the resist layer of one embodiment. FIG. 3A shows a resist layer deposited on a substrate with a chromium (Cr) layer deposited thereon 312. A substrate 300, including quartz 300, includes a deposition of chromium (Cr) layer 305 deposited on the surface of the substrate 300. A resist layer 310 is deposited on the surface of the chromium (Cr) layer 305.

A lamellar imprint template 320 is used to imprint the resist layer 310. An imprinted resist layer 325 is processed to descum and trim imprinted resist using an $O_2$ RIE 332. An $O_2$ RIE 330 alters the trimmed imprinted resist 335 to a predetermined thickness and width. The predetermined width is used to establish a density. The processes are described further in FIG. 3B.

Figure 3B:
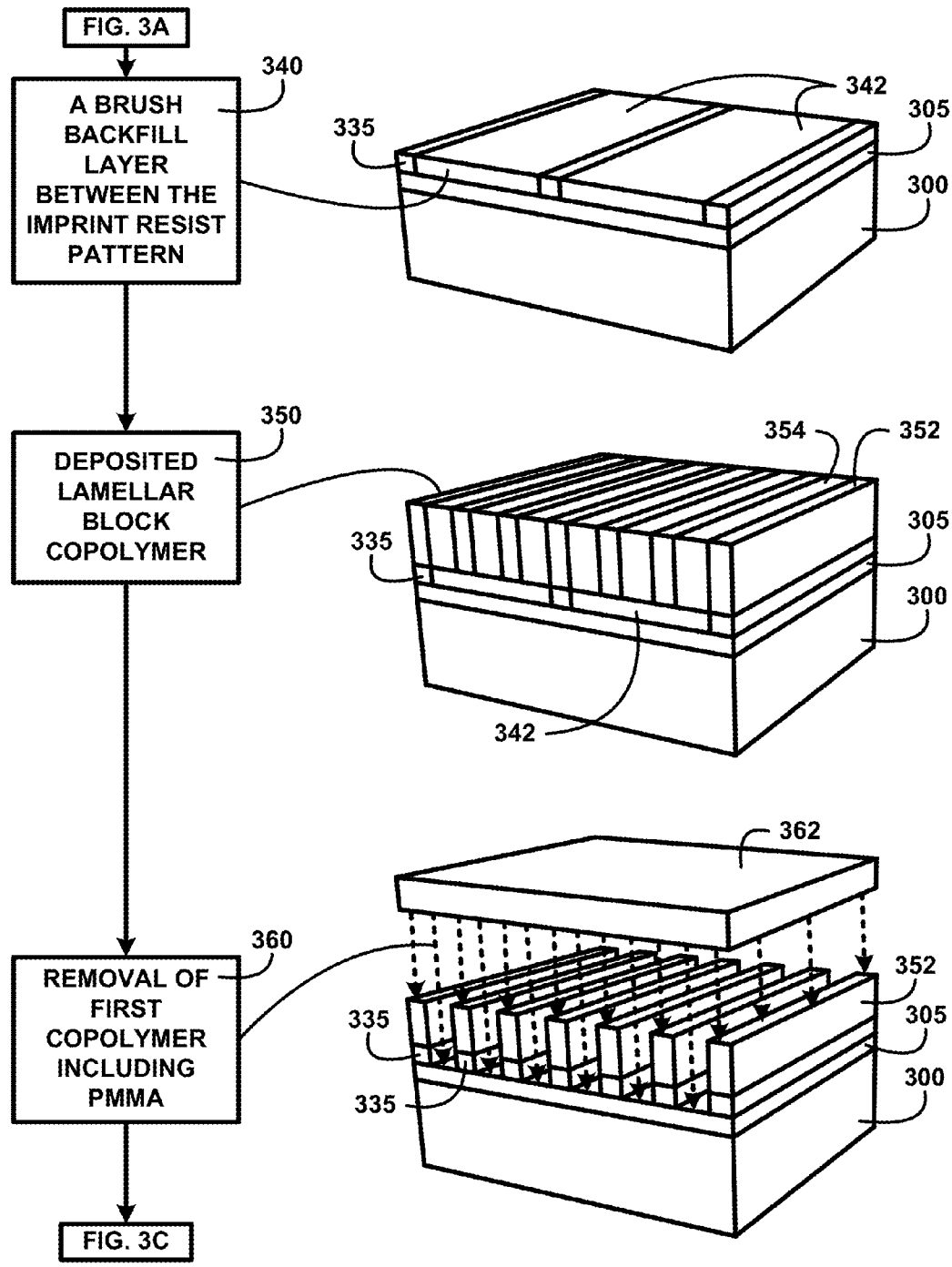
FIG. 3B shows for illustrative purposes only an example of a brush backfill chemical contrast pattern of one embodiment.

FIG. 3B shows for illustrative purposes only an example of a brush backfill chemical contrast pattern of one embodiment. FIG. 3B shows processes continuing from FIG. 3A. A brush backfill layer between the imprint resist pattern 340 is in contact with the surface of the chromium (Cr) layer 305 deposited on the substrate 300 including quartz.

A deposited lamellar block copolymer 350 is placed on the trimmed imprinted resist 335 and brush backfill layer 342. The deposited lamellar block copolymer 350 can include PS-b-PMMA. A DSA segregates the PS 352 and PMMA 354 polymers. Additional patterning includes removal of first copolymer including PMMA 360. The removal of first copolymer including PMMA 360 includes using an $O_2$ plasma RIE 362. Descriptions of additional processing are shown in FIG. 3C.

Figure 3C:
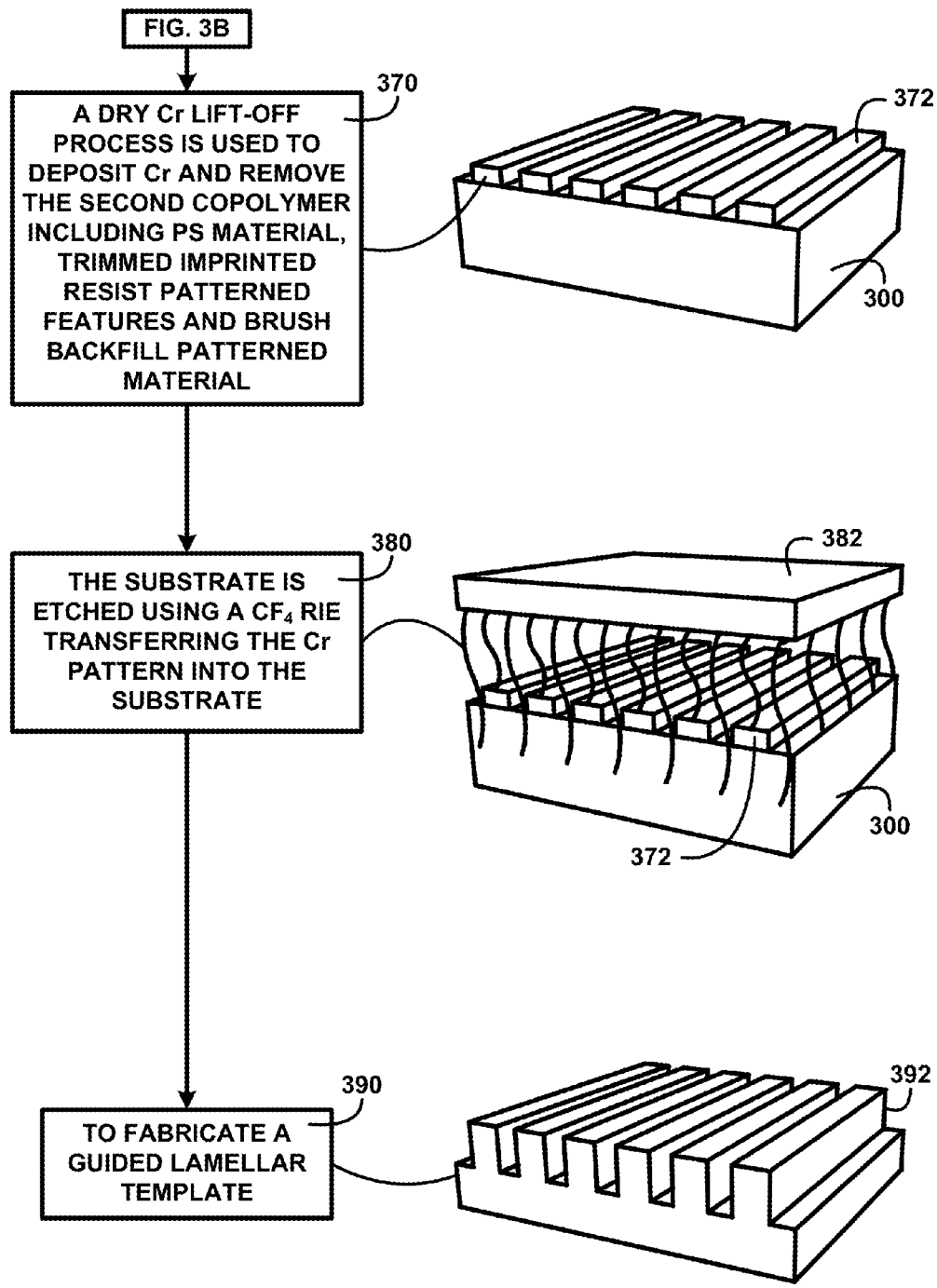
FIG. 3C shows for illustrative purposes only an example of a dry Cr lift-off process of one embodiment.

FIG. 3C shows for illustrative purposes only an example of a dry Cr lift-off process of one embodiment. FIG. 3C shows a continuation from FIG. 3B including where a dry Cr lift-off process is used to deposit Cr and remove the second copolymer including PS material, trimmed imprinted resist patterned features and brush backfill patterned material 370. The substrate 300 including quartz is processed using the patterned Cr layer 372 including using a $CF_4$ RIE 382. The substrate is etched using a $CF_4$ RIE transferring the Cr pattern into the substrate 380 to fabricate a guided lamellar template 390. A guided lamellar template 392 is used to imprint a stack with a magnetic material layer to create straight lines of magnetic BPM features.

Figure 4:
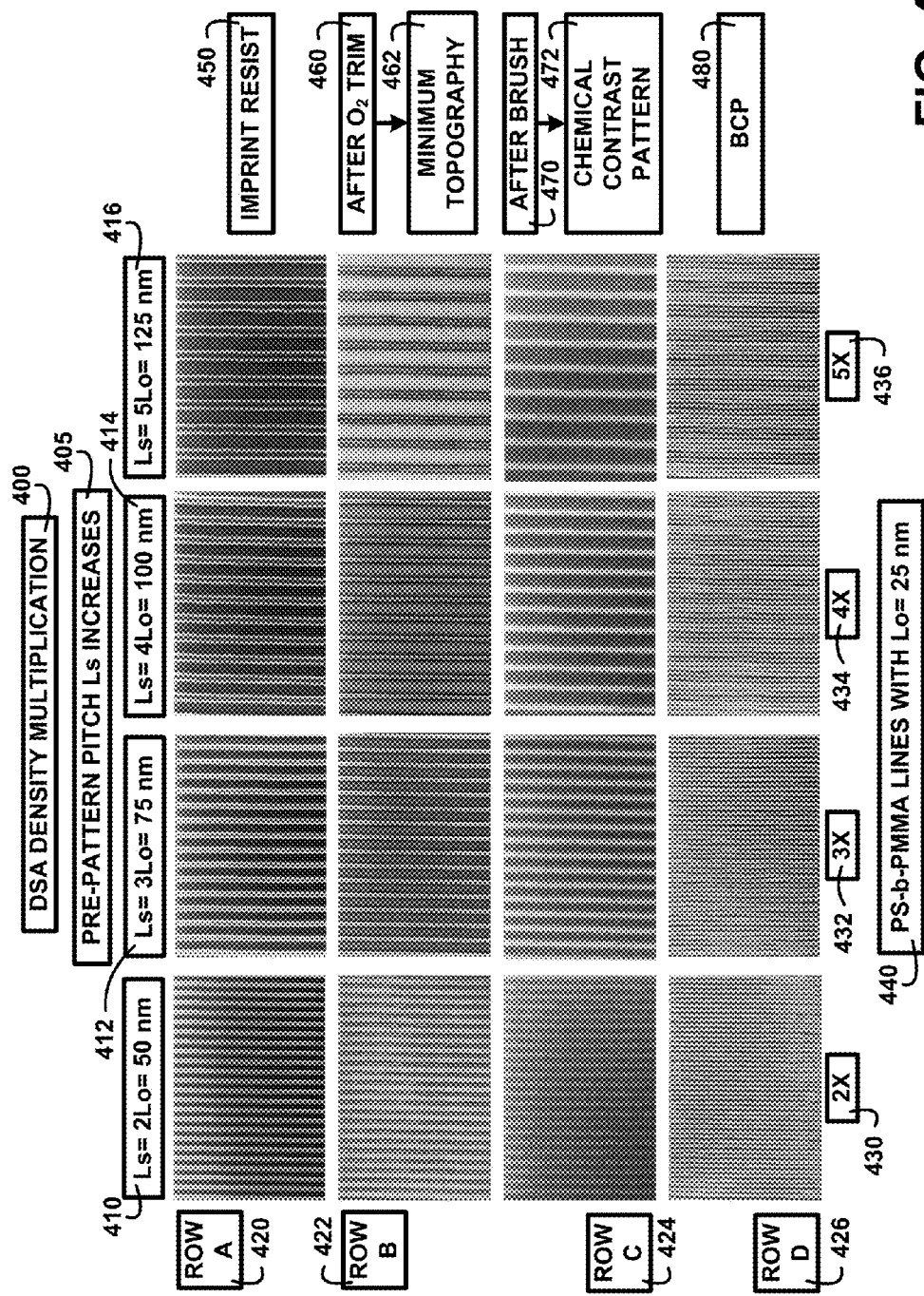
FIG. 4 shows for illustrative purposes only an example of DSA density multiplication of one embodiment.

FIG. 4 shows for illustrative purposes only an example of DSA density multiplication of one embodiment. FIG. 4 shows a method of DSA density multiplication 400 where a pre-pattern pitch Ls increases 405. The DSA density multiplication 400 uses BCP materials that include for example Ls=2Lo=50 nm 410, Ls=3Lo=75 nm 412, Ls=4Lo=100 nm 414 and Ls=5Lo=125 nm 416 to multiply the density by 2× 430, 3× 432, 4× 434 and 5× 436 respectively. Shown in Row A 420 are examples of a patterned imprint resist 450. Row B 422 shows the patterned imprint resist 450 after $O_2$ trim 460 used to create a minimum topography 462.

Row C 424 shows the trimmed imprinted resist features after brush 470 used to create a chemical contrast pattern 472. Row D 426 shows the respective BCP 480 after DSA with the respective multiplicative density for example in Row D 426 3× 432 the density is 3 times that produced using a BCP of PS-b-PMMA lines with Lo=25 nm 440. The use of various BCP materials is used to fabricate predetermined high density guided lamellar template 392 used to imprint a stack with a magnetic material layer to create straight lines of magnetic BPM features with the predetermined density.

The foregoing has described the principles, embodiments and modes of operation of the present invention. However, the invention should not be construed as being limited to the particular embodiments discussed. The above described embodiments should be regarded as illustrative rather than restrictive, and it should be appreciated that variations may be made in those embodiments by workers skilled in the art without departing from the scope of the present invention as defined by the following claims.

What is claimed is:

1. A method of fabricating an imprint template, comprising:
depositing a chromium layer on a surface of a substrate;
depositing a resist layer over the chromium layer;
imprinting and trimming the resist layer to form a trimmed imprinted resist;
using the trimmed imprinted resist and chemical contrast pattern to guide a directed self-assembly (DSA) of a predetermined lamellar block copolymer (BCP);
creating chromium (Cr) lamellar guiding lines in a mask using the BCP and DSA in a dry Cr lift-off process;
a Cr dry liftoff process to generate Cr lines including 10 nm Cr lines, wherein a second BCP feature including PS blocks are removed using 02 plasma to form Cr lines; and
etching the Cr lamellar guiding line into the substrate to fabricate the imprint template.

2. The method of claim 1, wherein the resist layer includes silicon, quartz, Cr or carbon that can be imprinted upon.

3. The method of claim 1, further comprising using the imprint resist pattern as a DSA pre-pattern.

4. The method of claim 1, further comprising using an imprint resist material having properties including at least solvent stability, thermal stability, and chemical neutrality with respect to BCPs.

5. The method of claim 4, further comprising using a resist material including solvent stability wherein the resist material is insoluble in most organic casting solvents used for BCP spin coating.

6. The method of claim 4, further comprising using a resist material with thermal stability and being thermally stable during the BCP thermal annealing process, wherein the DSA pre-patterns are left substantially non-degraded at a BCP annealing temperature, ranging from 165° C. to 250° C., for periods ranging from 8 to 12 hours.

7. The method of claim 1, further comprising the trimmed imprint resist thickness is reduced to a range from 3 to 10 nm.

8. The method of claim 1, wherein the chemical contrast pattern is created using a brush backfill layer material chemically neutral with respect to a BCP material that is deposited including using a spin-coating and including being annealed at 170° C. for 6 to 8 hours under vacuum and wherein the substrate is soaked in toluene for 20 minutes, and rinsed with isopropanol (IPA) and blow dried with N2 to process a brush backfill layer thickness to match the imprint resist thickness including a range of 3 to 10 nm.

9. The method of claim 1, further comprising a lamellar block copolymer (BCP) that includes a PS-b-PMMA thin film deposited using spin-coating to a thickness of 20 to 40 nm and thermally annealed in a vacuum oven at a temperature range of 160 to −170° C. for 12 to 18 hours to reach their equilibrium state, wherein the PMMA blocks are removed by flood exposing the wafer to deep ultraviolet (DUV) for 10 minutes then treated by $O_2$ RIE for 20 to 50 sec.

* * * * *